United States Patent [19]

Maidique

[11] 3,729,660

[45] Apr. 24, 1973

[54] IC DEVICE ARRANGED TO MINIMIZE THERMAL FEEDBACK EFFECTS

[75] Inventor: Modesto A. Maidique, Woburn, Mass.

[73] Assignee: Nova Devices, Inc., Wilmington, Mass.

[22] Filed: Nov. 16, 1970

[21] Appl. No.: 89,980

[52] U.S. Cl. ..............317/235 R, 317/235 Q, 330/23

[51] Int. Cl. ..............H01l 15/00

[58] Field of Search ..............317/235; 330/23

[56] References Cited

UNITED STATES PATENTS

| | | | |
|---|---|---|---|
| 3,383,614 | 5/1968 | Emmons et al. | 330/23 |
| 3,393,870 | 7/1968 | Jeffrey | 236/78 |
| 3,258,606 | 6/1966 | Meadows | 307/88.5 |
| 3,496,333 | 2/1970 | Alexander et al. | 219/216 |

*Primary Examiner*—John W. Huckert
*Assistant Examiner*—E. Wojciechowicz
*Attorney*—Bryan, Parmelee, Johnson & Bollinger

[57] ABSTRACT

An integrated circuit device having cascaded stages, wherein at least one relatively high-powered stage comprises two balanced sections at least one of which is divided into two parallel-operated sub-sections located symmetrically about a line passing through the effective center of an earlier, lowered-powered stage, thereby to minimize any effects of heat flow from the high-powered stage to the earlier stage.

8 Claims, 5 Drawing Figures

INVENTOR.
Modesto A. Maidique
BY

Bryan Parmelee, Johnson & Bollinger
ATTORNEYS

INVENTOR.
BY Modesto A. Maidique

Bryan, Parmelee, Johnson & Bollinger
ATTORNEYS

IC DEVICE ARRANGED TO MINIMIZE THERMAL FEEDBACK EFFECTS

This invention relates to integrated circuits. More particularly, this invention relates to high-gain electronic circuits diffused on a single chip of semi-conductor material or made from combinations of IC chips and discrete devices.

For a number of years now, a wide variety of electronic circuits have been produced in integrated monolithic form, whereby all of the circuit components are formed on an extremely small piece of semi-conductor material. The process of making electronic circuits by such techniques provides important manufacturing economies as well as substantial space savings for the component so constructed.

Much of the electronic circuitry produced at present requires as an essential building block thereof at least one high-gain, low-frequency signal-handling device. Typically such devices comprise a number of separate stages coupled together in cascaded fashion, to obtain the desired high-gain characteristic. Experience with such circuits made in monolithic form has demonstrated that the maximum amount of effective gain obtainable is limited by thermal feedback from the output stage to the input stage. That is, heat flowing through the semi-conductor chip from the output to the input alters the operation of the input stage in a manner comparable to the injection of an offset signal, thus introducing an error in the amplifier performance.

Since all of the components in a monolithic integrated circuit are diffused on a single slab of high thermal conductivity material (typically silicon), the thermal coupling between output and input is much higher than in comparable circuits made from separate parts wired on an isolating board. The seriousness of the problem can be appreciated from the fact that thermal feedback in monolithic amplifiers can in some cases introduce an error as high as 100 percent or more into the gain measurement.

Although some degree of such thermal feedback will occur between any two stages of a monolithic integrated circuit device, generally the most serious effects result from heat generated in the final output stage, and in some cases from heat generated in the driver stage preceding the output stage. This is because these stages ordinarily will be the largest power dissipators on the chip. Output power shifts introduce time varying signals at the input rather than a fixed offset which could be compensated for by conventional nulling arrangements.

The thermal feedback problem is complicated by the fact that the output (and driver) stages of the circuit typically comprise a pair of electrically balanced sections which are alternately energized. Thus, as the power shifts cyclically from one section to the other, time-varying heat gradients are produced which are angled with respect to the effective center of the input stage, and thereby introduce a parasitically coupled signal which adds to (or subtracts from) the true electrical signal.

In some previous amplifier designs, the effects of thermal feedback have been reduced by physically separating the output and input stages by a substantial distance (relatively speaking), as by placing the input and output stages at opposite ends of a long chip, with the output and driver transistors as close as possible to the axis of symmetry of the chip. Although such a construction is an improvement over earlier designs, it did not truly solve the problem of thermal feedback. For example, it did not avoid the development of time-varying heat gradients at different angles with respect to the input stage as the output power shifted between the two output transistor sections.

Accordingly, it is an object of this invention to provide a superior monolithic integrated circuit. A more specific object of this invention is to provide a signal-handling device having high gain with substantially reduced freedom from thermal feedback effects. Other objects, aspects and advantages of the invention will in part be pointed out in, and in part apparent from, the following description considered together with the accompanying drawings, in which.

Figure 1:
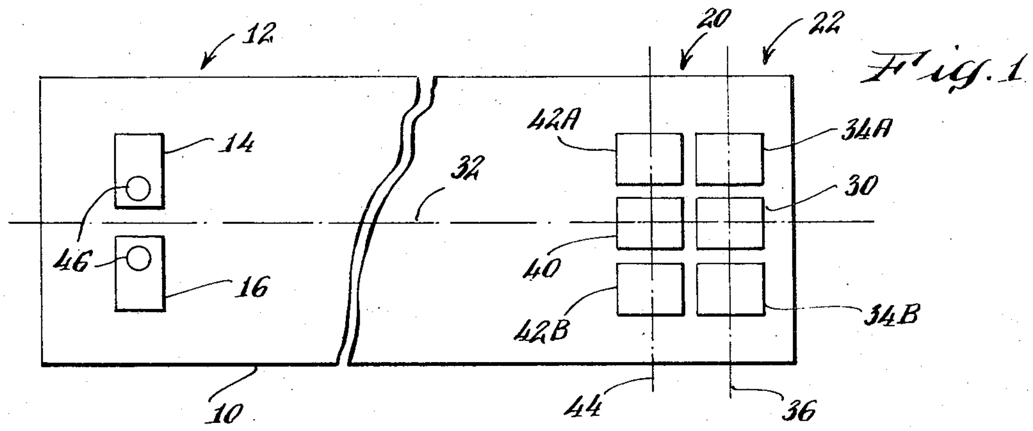
FIG. 1 shows in outline form the layout of a monolithic integrated circuit in accordance with the present invention.

Referring now to FIG. 1, there is shown an elongate rectangular chip 10 of silicon on which has been diffused, using known processes, a number of separate transistor elements which cooperate to provide a high-gain, low-frequency, multi-stage device. The input stage 12 is a balanced differential circuit configuration having two matched sections including a pair of identical transistors 14, 16 and associated conventional circuit elements (not shown). The signal produced by the input stage 12 is directed to a further series of conventional transistor amplifier stages (not shown) arranged in the usual intercoupled, cascaded format.

These further amplifier stages produce an intensified voltage signal which in typical prior art amplifiers is applied to a balanced driver stage arranged to supply a moderately high-powered drive signal to a balanced power output stage furnishing the output signal of the overall amplifier. In the usual construction of such prior art amplifiers, the driver and output stages each comprise two balanced (matched) sections normally in the form of a pair of identical transistors operable on alternate half cycles. These matched transistors of each stage are physically located as close to the central axis of the chip as possible, e.g. the two transistors may be equidistant from that axis, on opposite sides thereof. As noted previously, prior balanced amplifier arrangements of this general type have been found to have unsatisfactory gain characteristics, because when the power shifts from one amplifier section to the other in normal operation, there is a corresponding change in the direction (angle) of the thermal feedback through the chip of semiconductor material, and this change in direction causes the signal produced by the input stage to vary correspondingly.

One preferred design in accordance with the present invention includes balanced driver and output stages 20 and 22 (FIG. 1), electrically comparable to prior art arrangements such as referred to hereinabove. However, in accordance with an important aspect of this invention, at least the output stage, and advantageously the driver and in some cases other stages also, are arranged in a unique physical configuration or geometrical pattern adapted to substantially minimize the thermal feedback problems previously encountered.

In more detail, now, and referring first to the output stage 22, one section 30 thereof is physically located directly on the central axis or line of symmetry 32. The other section is divided into two separate and identical sub-sections 34A and 34B, each capable of handling one-half of the power requirements of that amplifier section. These sub-sections (or in this embodiment "-half-sections") are connected in parallel, and from an electrical viewpoint the composite of these two subsections performs exactly as a single-transistor amplifier section, i.e. the same as the section 30.

The active centers of the two sub-sections 34A and 34B are located on opposite sides of the central line of symmetry 32, at positions equidistant therefrom. These transistor centers moreover are located on a line 36 which is perpendicular to the central axis 32, and which passes through the center of the first-mentioned transistor 30. (As used herein, the "center" of the transistor will be considered to be the active area lying directly beneath the emitter.) Thus, it will be apparent that each of the two amplifier sections (30 and 34A, 34B) is located symmetrically about, or with respect to, the central line 32.

Although from an electrical/functional point of view, the output stage 22 performs in the same manner as a prior art amplifier stage wherein each of the balanced amplifier sections consists of a corresponding single transistor, from a heat flow point of view the output stage 22 is significantly different. Specifically, the heat developed in the single section 30 will always tend to flow straight down the central line 32 (i.e. along or parallel to the central line, ignoring the slight radial spreading of the heat flow which results from the fact that the heat source is more a concentrated local source than a line source). Similarly, the heat developed in the composite section 34A, 34B will always tend to flow straight down (i.e. along or parallel to) the central line 32. This is because the apparent heat center of the two sub-sections lies directly on the central line 32. This apparent heat center is superimposed on the actual heat center of the first section 30.

Accordingly, even though the heat energy in the two separate amplifier sections 30; 34A, 34B may rise and fall alternately, or otherwise be out of time phase, there will be no corresponding fluctuation in the overall direction of heat flow. The heat gradients along the axis 32 may of course vary in magnitude (intensity), but there will be no comparable change in the shape (geometrical pattern) of such gradients. In effect, the arrangement of the output stage 22 will produce isotherms, illustrated by lines 38, which are straight (or nearly so) and perpendicular to the axis 32 where they cross that axis.

The driver stage 20 also is laid out in a heat-symmetry arrangement with respect to the central axis 32, just as is the output stage 22. That is, one section 40 of the driver stage is positioned directly on the central axis 32, while the other section is divided into two identical parallel-connected sub-sections 42A, 42B, located on opposite sides of the central axis, equidistant therefrom, and on a line 44 perpendicular to the central axis 32. This line 44 passes through the centers of all transistors 40, 42A, 42B.

For the reasons discussed hereinabove with respect to the output stage 22, the heat generated in either of the two balanced driver sections (i.e. single section 40, or composite section 42A, 42B) will tend to flow on paths along or parallel to the central axis 32. Thus this heat flow will create isotherms which are curved lines perpendicular to the central axis where they cross the axis and symmetrical with respect to the input stage, independently of the phase relationship of the power variations in the two driver sections.

The two balanced sections 14, 16 of the input stage 12 also are located symmetrically about the central axis or line 32. That is, the heat-affected centers (emitters 46) of these two sections are positioned on opposite sides of the central line, equidistantly therefrom, and on a line perpendicular to the central axis. In effect, the central axis passes through the apparent center of the input stage. Thus, because the heat flow from the driver and output stages 20 and 22 is along or substantially parallel to the central axis, tending to produce isotherms perpendicular to the central axis, the effects of such heat flow on the two input sections will tend to be equal, i.e. the temperatures of the two sections will be the same regardless of fluctuations in the total heat flow.

Since the input circuit 12 is a balanced differential configuration, the change in signal out of one section produced by a change in temperature of that one section will be effectively cancelled by the equal (but oppositely directed) change in the signal from the other section. Thus, the overall gain characteristics of the input circuit will be substantially unaffected by the heat flow from the driver and output stages.

The functioning of the invention as described above depends upon the two output (and driver) sections having similar electrical characteristics, that is, the electrical design of the output (and driver) stage should be symmetrical for the + or − swing, as is typical in such amplifier designs. The saturation characteristics of the two sections also should be matched, so that independence of the power distribution from the magnitude of the output voltage can continue to be maintained during conditions of maximum swing.

The single output section 30 may be operated in phase with the single driver section 40, so that the composite output section 34A, 34B will be operated in phase with the composite driver section 42A, 42B. However, there may in some applications be an advantage in using a reverse relationship. Thus for example during a time that the single output section 30 is being heavily energized, the composite driver section 42A, 42B will be comparably heavily energized. The single output section will produce a heat flow down axis 32 having a slight radial spreading of the gradient lines at small distances away from the axis. Conversely, the composite driver section will (because there are actually two separate sources) produce a heat flow down axis 32 with gradient lines near the axis inclining towards the axis at a very slight angle. Thus, by operating these two sections in phase, there can be a compensation effect whereby the overall gradient lines of the total heat flow will be more closely parallel to the central axis, and so that the isotherms will be more nearly perpendicular to the axis.

Figure 2:
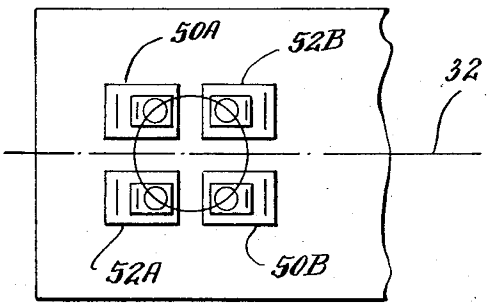
FIG. 2 shows in outline form the layout of a modified balanced differential input circuit for the device.
Figure 3:
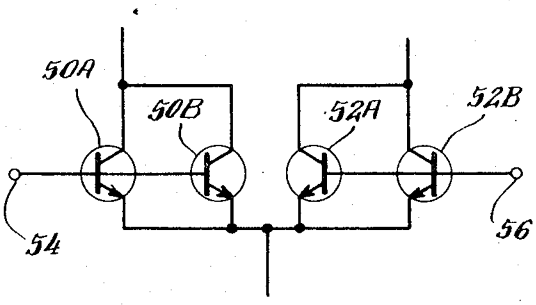
FIG. 3 is a schematic diagram of the transistor arrangement of FIG. 2.

Because the heat flow pattern in a small finite integrated-circuit element can never be perfectly ideal, due to edge effects and the like, there will be an additional advantage for some applications in employing as the input stage a so-called criss-cross circuit configuration. As illustrated in FIGS. 2 and 3, such a circuit configuration comprises separate transistors 50A, 50B; 52A, 52B. Two diagonally opposite transistors 50A, 50B are connected in parallel to form one section of the balanced differential input circuit, and are controlled by one input terminal 54. The other two transistors 52A, 52B similarly are connected in parallel to form the other input section, controlled by the other input terminal 56.

Such a criss-cross configuration provides first-order compensation tending to minimize the effects of angled temperature gradients. Therefore, to the extent that such angled gradients may not be entirely eliminated by the symmetrical power stage configuration described hereinabove, due to normal non-linearities and other uncontrollable factors, the criss-cross input circuit will aid in further reducing the effects of thermal feedback on the operation of the amplifier.

Figure 4:
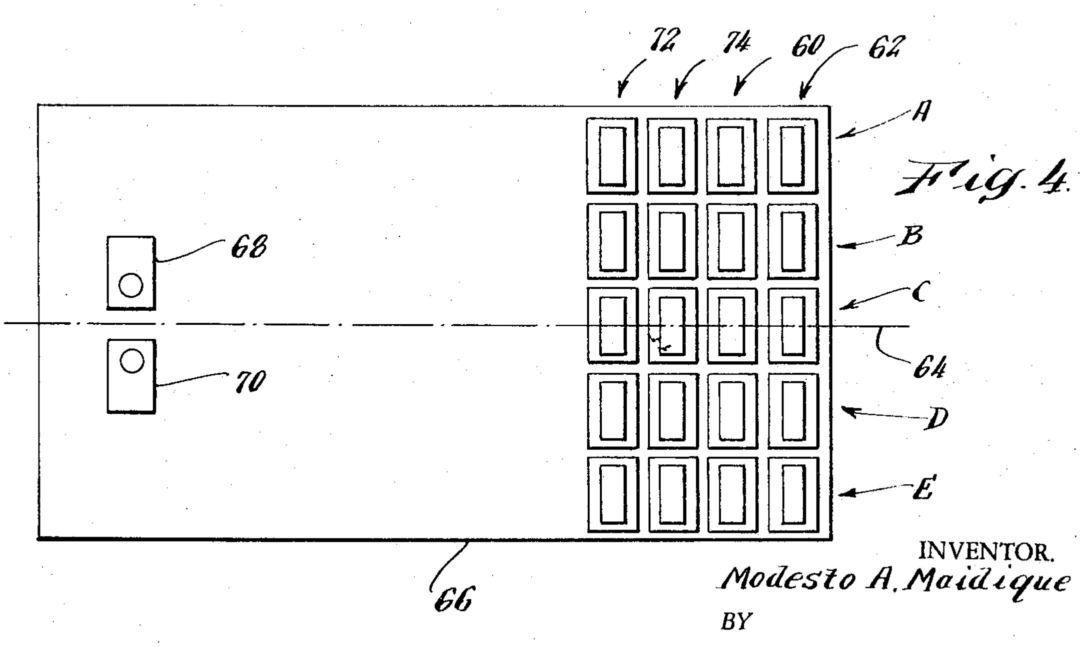
FIG. 4 illustrates modified driver and output stages.

As shown in FIG. 4, both sections of the driver and output amplifiers can for certain applications advantageously be divided into identical sub-sections. The number of such sub-sections may in general be any selected value ($n$) depending upon practical construction considerations and the like. The FIG. 4 embodiment shows an arrangement having an odd number (five, in this particular instance) of sub-sections for each section.

The sub-sections 60A–E, 62A–E of each of the two matched output sections 60 and 62 are arranged in corresponding side-by-side columns perpendicular to the central axis 64, and parallel to the adjacent side 66 of the chip. All of the sub-sections 60A–E (e.g. the negative output transistors) are energized in parallel, and similarly all of the other sub-sections 62A–E are energized in parallel. Such a columnar arrangement presents a more nearly straight line source of heat, tending to reduce curvature in the isotherms down the central axis. This in turn tends further to minimize any temperature differential between the separate sections 68, 70 of the input stage.

The same lay-out can be used for the matched driver sections 72, 74, as by dividing each section into five identical and parallel-connected sub-sections 72A–E, 74A–E. Thus the heat energy contributed by the driver will also appear to be from a more nearly line source, perpendicular to the central axis 64. For the reasons discussed hereinabove, this will further aid in maintaining the two input sections 68, 70 at equal temperature throughout all operating conditions of the amplifier.

Figure 5:
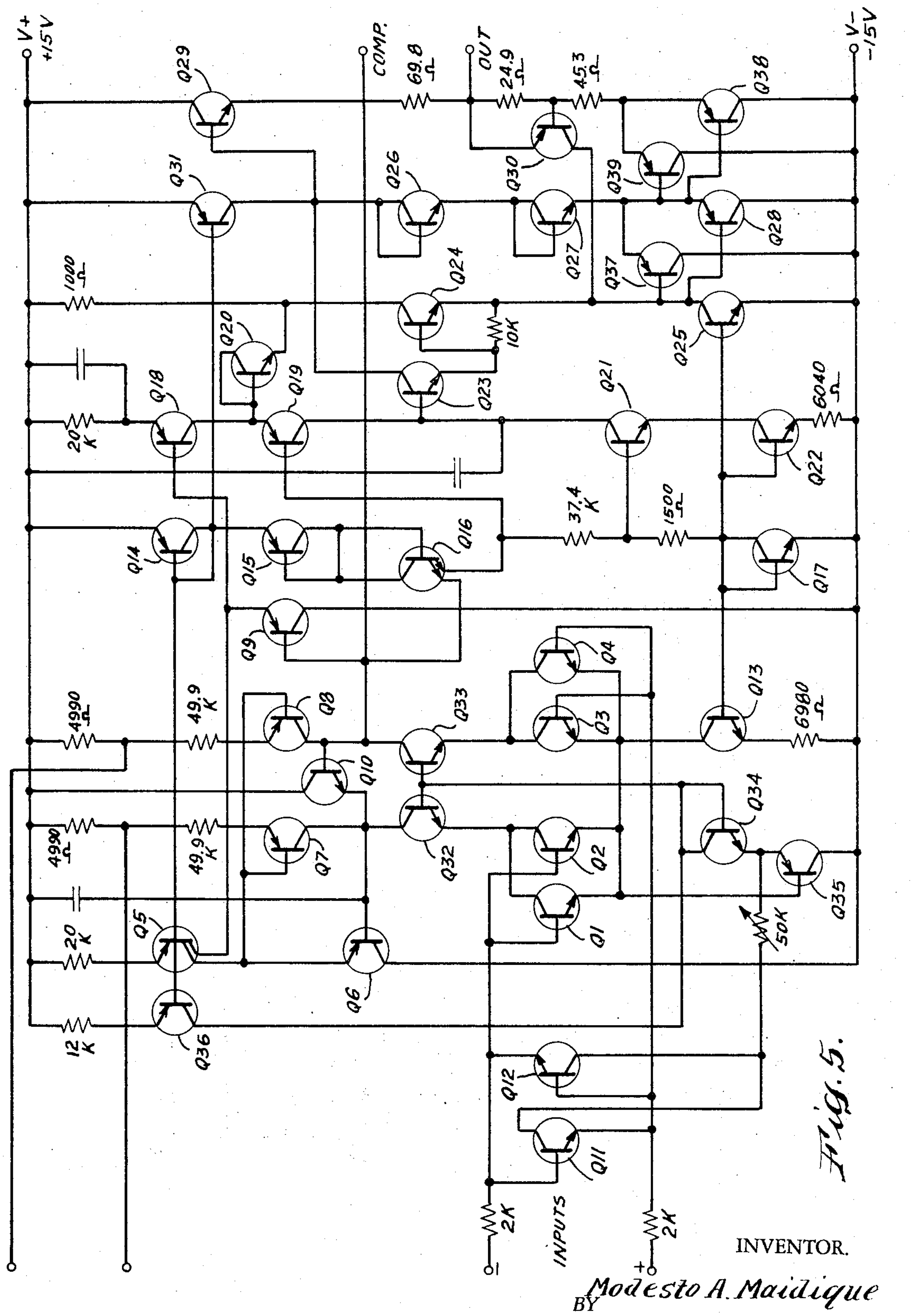
FIG. 5 is a schematic diagram showing an amplifier design adapted to be constructed in accordance with the present invention.

FIG. 5 has been included to show the circuit diagram of a representative amplifier with which the present invention can be used to good effect.

Although several embodiments of the present invention have been described hereinabove in detail, it is desired to emphasize that this has been for the purpose of illustrating the invention and explaining its general principles of operation; such illustrative material should not be construed as necessarily limiting of the invention, since it is evident that many modifications can be made within the scope of the invention by those skilled in this art for the purpose of meeting the requirements of specific applications.

I claim:

1. In an electronic signal processing device comprising a chip of semi-conductor material arranged to provide at least first and second individual signal processing stages so related that the heat from said second stage flows through the chip material to said first stage to affect the operating characteristics thereof, said first stage being so arranged as to be adversely affected by heat flow arriving in a direction other than along a line passing between the apparent centers of said first and second stages;

said second stage being of the type having two balanced sections operable alternately in processing an electronic signal;

the improvement for minimizing the effect on said first stage of heat flow from said second stage wherein at least one of said two balanced sections is structurally sub-divided at least two separate and functionally identical sub-sections which are connected in parallel and which, when both are activated by an input signal, produce equal amounts of heat which could affect said first stage, said two sub-sections being positioned symmetrically on opposite sides of said line passing through the apparent centers of both said first and second stages, whereby the net heat flow from said two sub-sections to said first stage is along said line so as to substantially minimize the effect on said first stage of heat flow from said second stage;

the other of said balanced sections being positioned symmetrically with respect to said line passing through the apparent centers of both said first and second stages, so that heat generated in said other section also flows in a direction along said line towards said first stage with resultant minimal effect on the operational characteristics of said first stage.

2. A device as claimed in claim 1, wherein said first stage comprises the input stage of the device; said second stage serving as a power output stage for the device.

3. A device as claimed in claim 2, wherein said input stage includes a pair of balanced sections substantially equidistant from said line.

4. A device as claimed in claim 1, wherein the other section of said second stage is located on said line; there being an even number of said sub-sections, one-half on each side of said line.

5. A device as claimed in claim 4, including a driver stage comprising a pair of balanced sections one of which includes two sub-sections disposed symmetrically on opposite sides of said line and the other of which is on said line.

6. A device as claimed in claim 1, wherein each of said two sections consists of a respective set of sub-sections disposed symmetrically about said line.

7. A device as claimed in claim 6, wherein said sets of sub-sections are arranged in corresponding side-by-side columns perpendicular to said line.

8. A device as claimed in claim 7, including a balanced driver stage having two alternately operable sections, each of said driver sections comprising respective sets of sub-sections arranged in corresponding side-by-side columns perpendicular to said line.

* * * * *